(12) United States Patent
Yasuzumi et al.

(10) Patent No.: US 12,550,405 B2
(45) Date of Patent: Feb. 10, 2026

(54) SEMICONDUCTOR DEVICE

(71) Applicants:KABUSHIKI KAISHA TOSHIBA, Tokyo (JP); Toshiba Electronic Devices & Storage Corporation, Tokyo (JP)

(72) Inventors: Takenori Yasuzumi, Kanagawa (JP); Hung Hung, Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 354 days.

(21) Appl. No.: 18/180,657

(22) Filed: Mar. 8, 2023

(65) Prior Publication Data

US 2024/0113175 A1   Apr. 4, 2024

(30) Foreign Application Priority Data

Oct. 3, 2022 (JP) ................................. 2022-159644

(51) Int. Cl.
*H01L 29/40* (2006.01)
*H10D 30/47* (2025.01)
(Continued)

(52) U.S. Cl.
CPC ......... *H10D 64/112* (2025.01); *H10D 30/475* (2025.01); *H10D 62/8503* (2025.01)

(58) Field of Classification Search
None
See application file for complete search history.

(56) References Cited

U.S. PATENT DOCUMENTS 10,868,163 B2  12/2020  Hung et al.
11,152,480 B2  10/2021  Shindome et al.
(Continued)

FOREIGN PATENT DOCUMENTS

JP   2008-078601 A   4/2008
JP   2012-109492 A   6/2012
(Continued)

OTHER PUBLICATIONS

Office Action issued in Japanese Patent Application No. 2022-159644 dated Oct. 14, 2025, in 9 pages.

*Primary Examiner* — William C Trapanese
(74) *Attorney, Agent, or Firm* — Knobbe, Martens, Olson & Bear, LLP

(57) ABSTRACT

According to one embodiment, a semiconductor device includes: a first nitride semiconductor layer provided on a substrate; a second nitride semiconductor layer provided on the first nitride semiconductor layer and having a band gap wider than that of the first nitride semiconductor layer; a source electrode and a drain electrode, being provided on the second nitride semiconductor layer separately from each other; a gate electrode provided on the second nitride semiconductor layer and arranged between the source electrode and the drain electrode; a first field plate electrode provided on the second nitride semiconductor layer, arranged between the gate electrode and the drain electrode, and electrically coupled to the source electrode; and a second field plate electrode provided on the first field plate electrode and formed to project toward the gate electrode.

7 Claims, 5 Drawing Sheets

(51) Int. Cl.
*H10D 62/85* (2025.01)
*H10D 64/00* (2025.01)

(56) References Cited

U.S. PATENT DOCUMENTS

| | | |
|---|---|---|
| 2005/0253168 A1 | 11/2005 | Wu et al. |
| 2008/0073670 A1 | 3/2008 | Yang et al. |
| 2012/0126287 A1 | 5/2012 | Aoki |
| 2019/0140086 A1 | 5/2019 | Chikamatsu |
| 2020/0295171 A1 | 9/2020 | Hung et al. |
| 2021/0384303 A1* | 12/2021 | Zhang ................ H01L 21/7605 |
| 2022/0093747 A1 | 3/2022 | Ohno et al. |
| 2022/0293745 A1 | 9/2022 | Isobe et al. |

FOREIGN PATENT DOCUMENTS

| | | |
|---|---|---|
| JP | 2013-153189 A | 8/2013 |
| JP | 2015-170821 A | 9/2015 |
| JP | 2020-047741 | 3/2020 |
| JP | 2020-150193 | 9/2020 |
| JP | 2021-009887 | 1/2021 |
| JP | 2022-053102 A | 4/2022 |
| JP | 2022-138569 A | 9/2022 |

* cited by examiner

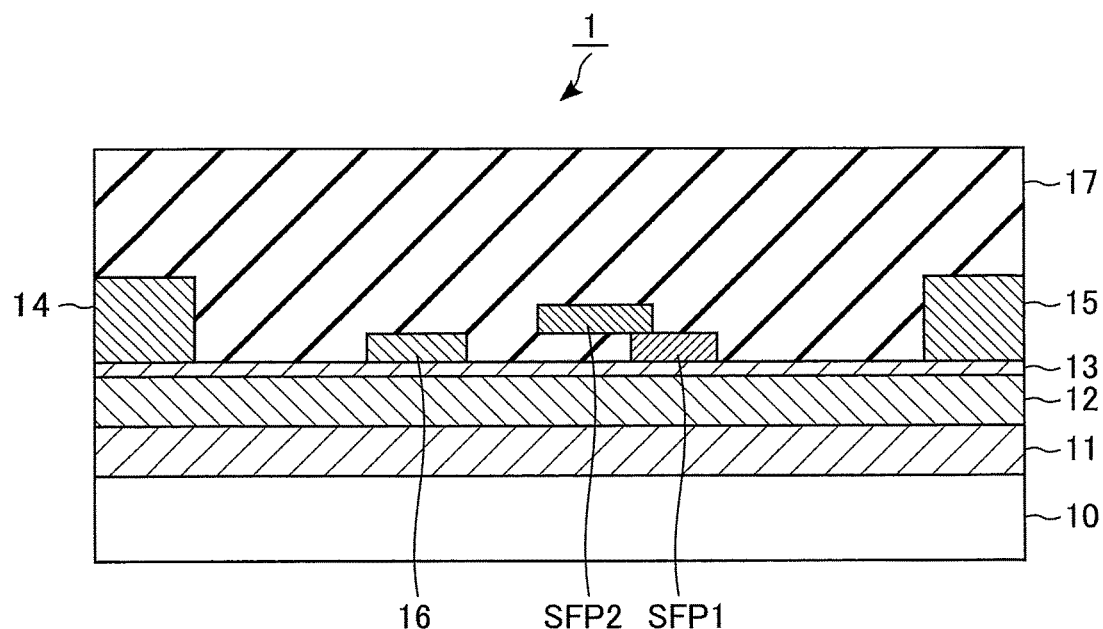
F I G. 1
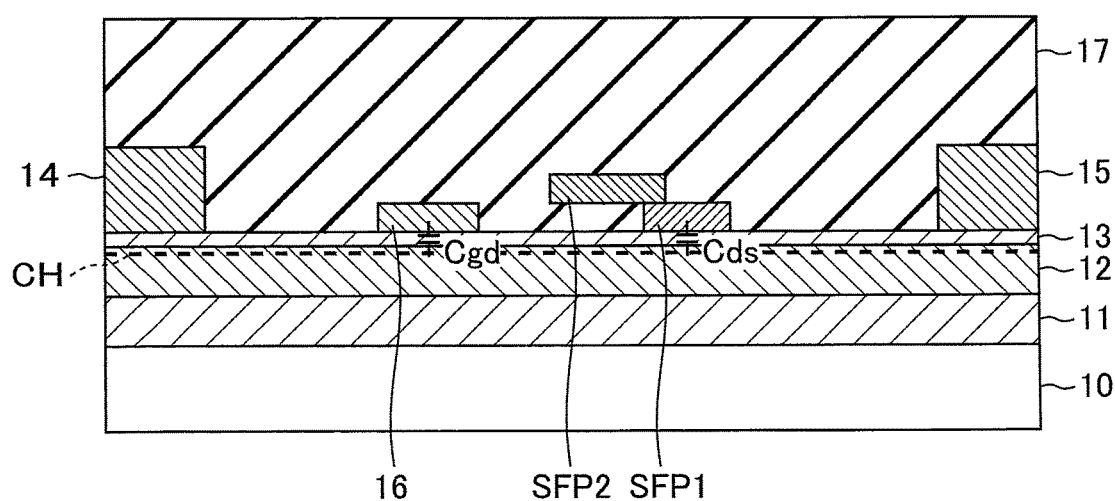
F I G. 2

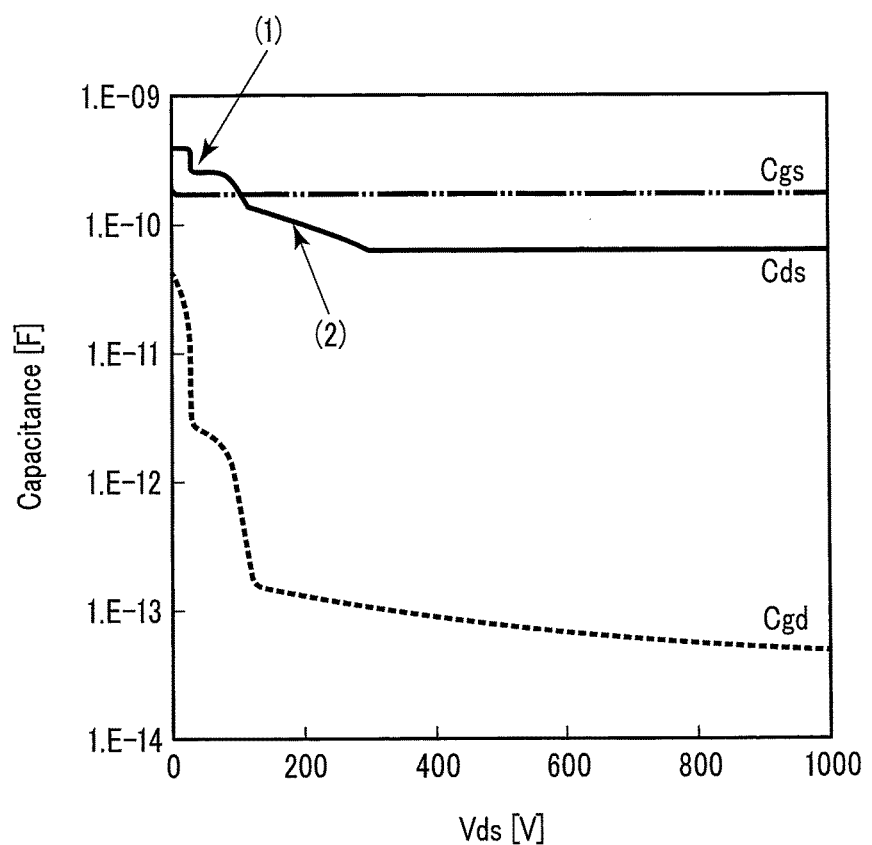
F I G. 3

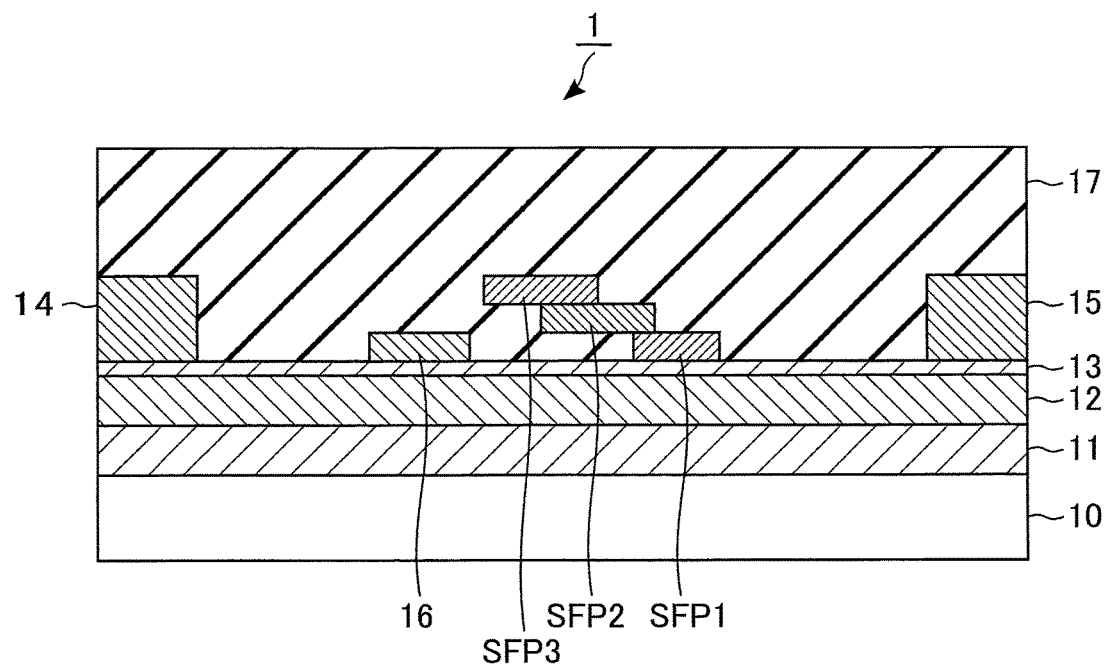
F I G. 4
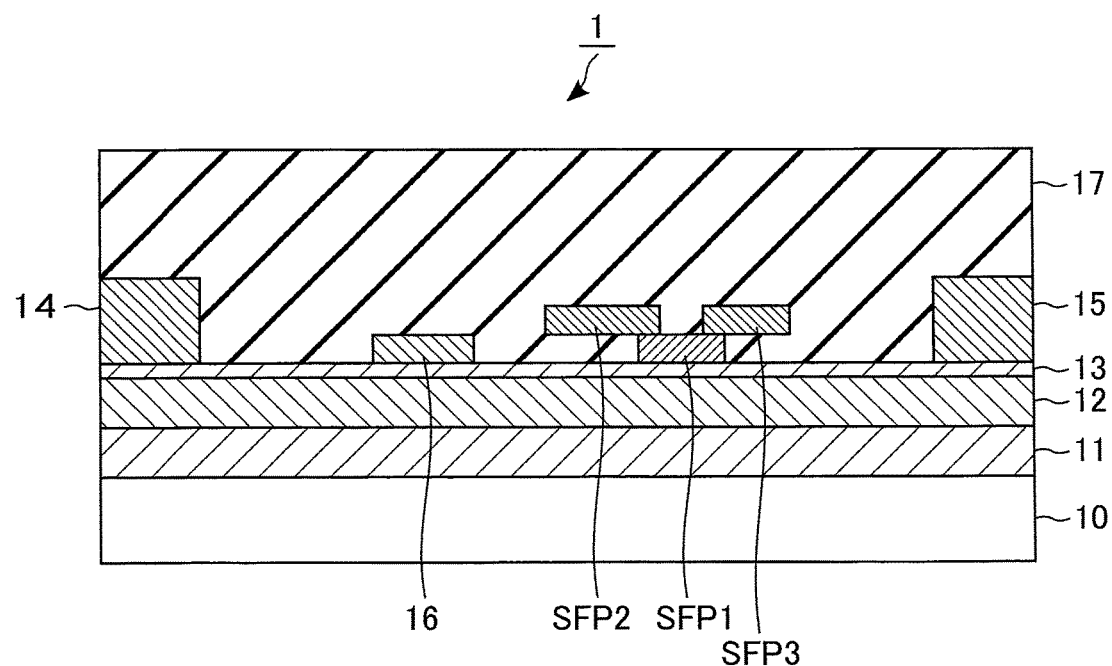
F I G. 5

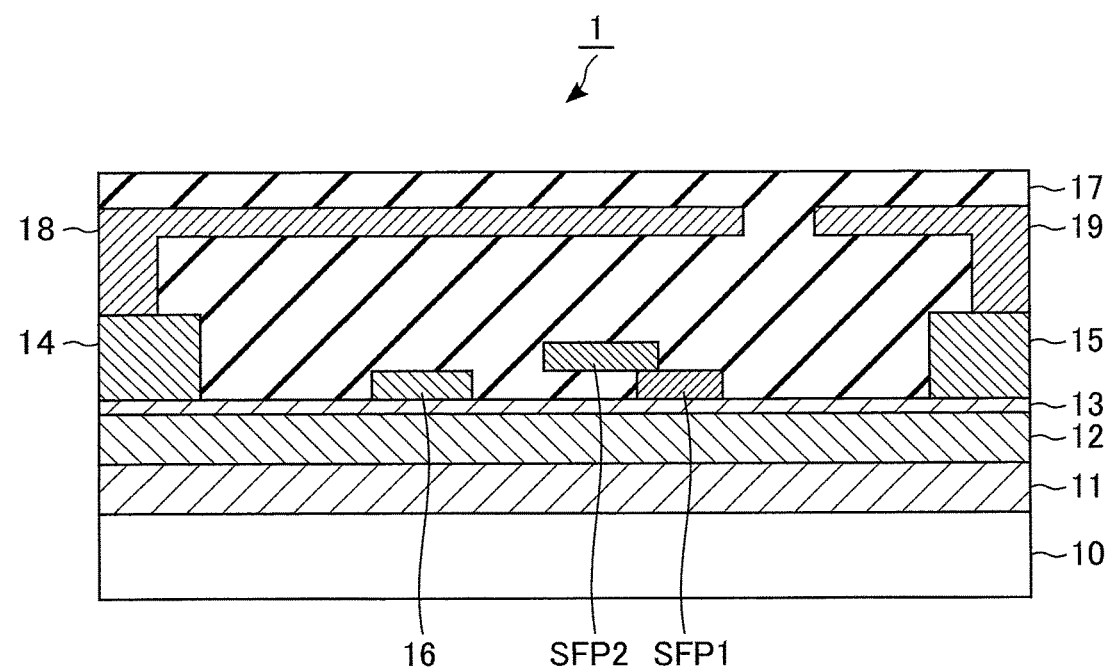
F I G. 8

SEMICONDUCTOR DEVICE

CROSS-REFERENCE TO RELATED APPLICATIONS

This application is based upon and claiming the benefit of priority from Japanese Patent Application No. 2022-159644, filed Oct. 3, 2022, the entire contents of which are incorporated herein by reference.

FIELD

Embodiments described herein relate generally to a semiconductor device.

BACKGROUND

Semiconductor devices, such as transistors and diodes, are used for circuits, such as a switching power supply circuit and an inverter circuit. There are demands for high withstand voltage and low on-resistance for such semiconductor devices. Withstand voltage and on-resistance are in a trade-off relationship which is determined by the materials used for devices.

With progress in technological developments a semiconductor device having an on-resistance as low as a limit for silicon, which is a main material used for semiconductor devices, has been realized. In order to further improve withstand voltage or to further reduce on-resistance, it is necessary to change device materials. The trade-off relationship, which is determined by device materials, can be improved if a nitride semiconductor, such as gallium nitride or aluminum gallium nitride, is used as a material for semiconductor devices. It is thus possible to realize dramatic improvements in high withstand voltage and low on-resistance of semiconductor devices.

In order to secure low loss and high reliability in a transistor using a nitride semiconductor, reduction of a gate-drain capacitance Cgd as a parasitic capacitance and relaxation of a local concentration of electric field that occurs in a circuit during an operation are required. To relax an electric field concentration of a transistor, a field plate electrode is used.

It is possible to improve a switching rate and reduce switching loss through a reduction of a gate-drain capacitance Cgd. However, the reduction of the gate-drain capacitance Cgd would increase noise during a switching operation.

BRIEF DESCRIPTION OF THE DRAWINGS

FIG. 1 is a cross-sectional view of a semiconductor device according to a first embodiment.

FIG. 2 is a diagram explaining an operation of the semiconductor device.

FIG. 3 is a graph explaining the relationship between a drain-source voltage and a capacitance.

FIG. 4 is a cross-sectional view of a semiconductor device according to a second embodiment.

FIG. 5 is a cross-sectional view of a semiconductor device according to a third embodiment.

FIG. 8 is a cross-sectional view of a semiconductor device according to a sixth embodiment.

DETAILED DESCRIPTION

Figure 6:
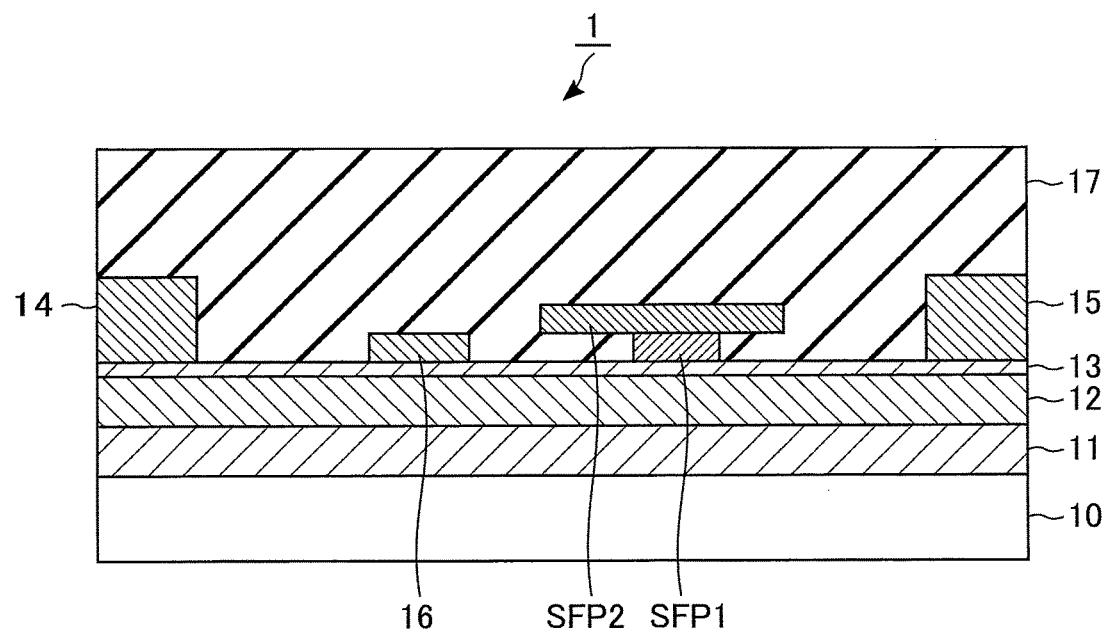
FIG. 6 is a cross-sectional view of a semiconductor device according to a fourth embodiment.

According to one embodiment, a semiconductor device comprising:
a first nitride semiconductor layer provided on a substrate;
a second nitride semiconductor layer provided on the first nitride semiconductor layer and having a band gap wider than that of the first nitride semiconductor layer;
a source electrode and a drain electrode, being provided on the second nitride semiconductor layer separately from each other;
a gate electrode provided on the second nitride semiconductor layer and arranged between the source electrode and the drain electrode;
a first field plate electrode provided on the second nitride semiconductor layer, arranged between the gate electrode and the drain electrode, and electrically coupled to the source electrode; and
a second field plate electrode provided on the first field plate electrode and formed to project toward the gate electrode.

A description will now be given of the embodiments with reference to the accompanying drawings. Several embodiments described below merely show exemplary apparatuses and methods that implement the technical ideas of the present invention. The technical ideas are not limited by the element shapes, structures, arrangements, etc. described below. Each of the function blocks can be implemented in the form of hardware, computer software, or a combination thereof. The function blocks do not have to be categorized as in the example described below. For example, part of the functions may be implemented by a function block other than the exemplary function blocks. In addition, the exemplary function blocks may be further divided into function sub-blocks. In the description below, structural elements having substantially the same functions and configurations will be denoted by the same reference symbols and a repetitive description of such elements will be omitted.

1. First Embodiment 1-1. Structure of Semiconductor Device 1

FIG. 1 is a cross-sectional view of a semiconductor device 1 according to a first embodiment. The semiconductor device 1 is a nitride semiconductor device using a nitride semiconductor as a compound. The semiconductor device 1 is a field-effect transistor (FET), more specifically a high electron mobility transistor (HEMT).

The semiconductor device 1 includes a substrate 10, a buffer layer 11, a channel layer 12, a barrier layer 13, a source electrode 14, a drain electrode 15, a gate electrode 16, and field plate electrodes SFP1 and SFP2.

The substrate 10 is constituted by a silicon (Si) substrate, for example. As the substrate 10, silicon carbide (SiC), gallium nitride (GaN), gallium phosphide (GaP), indium phosphide (InP), gallium arsenide (GaAs), or sapphire ($Al_2O_3$) may be used. The substrate 10 may be constituted by an SOI (silicon on insulator) substrate in which an insulator layer ($SiO_2$) is inserted between an Si substrate and a surface Si layer.

A buffer layer 11 is provided on the substrate 10. The buffer layer 11 has the functions of relaxing a distortion caused by a difference between a lattice constant of a nitride semiconductor layer formed on the buffer layer 11 itself and a lattice constant of the substrate 10, and of controlling crystallinity of the nitride semiconductor layer formed on the buffer layer 11 itself. The buffer layer 11 is constituted by $Al_WGa_{1-W}N(0<W≤1)$, for example. The buffer layer 11 may be constituted by stacking multiple $Al_WGa_{1-W}N$ layers having different composition ratios. In this case, a composition ratio of the multiple layers may be adjusted so that the lattice constant changes from the lowermost layer to the uppermost layer. The buffer layer 11 may be constituted by stacking aluminum nitride (AlN) layers and gallium nitride (GaN) layers in an alternate manner.

A channel layer 12 is provided on the buffer layer 11. The channel layer 12 is a layer in which a channel (current path) of a transistor is formed. The channel layer 12 may be called an electron transport layer. The channel layer 12 is constituted by a nitride semiconductor, for example a nitride semiconductor having good crystallinity (i.e., a high-quality nitride semiconductor). The channel layer 12 is, for example, undoped aluminum gallium nitride $(Al_XGa_{1-X}N$ ($0≤X<1$). Specifically, the channel layer 12 is, for example, undoped gallium nitride (GaN). "Undoped" means a semiconductor deliberately not doped with an impurity, and an unintentional intrusion of impurity during a manufacturing process can be considered as "undoped". In the present specification, "undoped" means that a concentration of impurities is $2×10^{16}$ cm$^{-3}$ or lower. The thickness of the channel layer 12 is for example 0.1 μm or greater and 10 μm or smaller.

A barrier layer 13 is provided on the channel layer 12. The barrier layer 13 is constituted by a nitride semiconductor. The barrier layer 13 may be called an "electron supply layer". The band gap of the barrier layer 13 is wider than that of the channel layer 12. The barrier layer 13 is constituted by undoped aluminum gallium nitride $(Al_YGa_{1-Y}N(0<Y≤1, X<Y))$, for example. More specifically, the barrier layer 13 is constituted by undoped AlGaN. A composition ratio of Al in the AlGaN layer serving as the barrier layer 13 is in the order of 0.2, for example. The thickness of the barrier layer 13 is for example 2 nm or greater and 100 nm or smaller.

The semiconductor layers constituting the semiconductor device 1 are formed one by one through epitaxial growth using the MOCVD (metal organic chemical vapor deposition) method, for example. In other words, the plurality of semiconductor layers constituting the semiconductor device 1 are constituted by epitaxial layers.

On the barrier layer 13, a source electrode 14 and a drain electrode 15 are provided, being separated from each other. A gate electrode 16 is also provided on the barrier layer 13 and between the source electrode 14 and the drain electrode 15, being separated from the source electrode 14 and the drain electrode 15.

The gate electrode 16 and the barrier layer 13 are in contact with a Schottky barrier junction. In other words, the gate electrode 16 is formed so as to include a material that is brought into contact with the barrier layer 13 by a Schottky barrier junction. As the gate electrode 16, titanium nitride (TiN) is used, for example. The semiconductor device 1 shown in FIG. 1 is a Schottky barrier type HEMT. The semiconductor device 1 is not limited to a Schottky barrier type HEMT, and may be an MIS (metal insulator semiconductor) type HEMT in which a gate insulating film is interposed between the barrier layer 13 and the gate electrode 16.

The source electrode 14 and the barrier layer 13 are in contact with an ohmic contact. Similarly, the drain electrode 15 and the barrier layer 13 are in contact with an ohmic contact. In other words, each of the source electrode 14 and the drain electrode 15 is formed so as to contain a material that is brought into contact with the barrier layer 13 with an ohmic contact. As the source electrode 14 and the drain electrode 15, a stacking structure in which titanium (Ti) and aluminum (Al) are stacked in this order, for example.

An insulating layer 17 is provided on the barrier layer 13, the gate electrode 16, the source electrode 14, and the drain electrode 15. The insulating layer 17 is made of silicon oxide ($SiO_2$), silicon nitride (SiN), or a high-dielectric (high-k) material. As a high-k material, hafnium oxide ($HfO_2$) may be used.

(Structure of Field Plate Electrode)

Next, the structures of field plate electrodes SFP1 and SFP2 are described. The field plate electrode has a function of relaxing a concentration of electric field at a particular point, such as agate electrode edge, and of improving withstand voltage. The field plate electrodes SFP1 and SFP2 are electrically coupled to the source electrode 14. In other words, the field plate electrode SFP1 and SFP2 are set at the same potential (for example, 0 V) as the source electrode 14. For example, the field plate electrodes SFP1 and SFP2 are electrically coupled to terminals (pads) for applying a voltage to the source electrode 14.

The field plate electrode SFP1 is provided on the barrier layer 13 and between the gate electrode 16 and the drain electrode 15. The field plate electrode SFP1 has a function of relaxing a local concentration of electric field in the barrier layer 13. The height of the field plate electrode SFP1 is set to be, for example, smaller than the height of the gate electrode 16. For example, the height of the field plate electrode SFP1 is set to be the same as the height of the gate electrode 16. The field plate electrode SFP1 is made of the same conductive material as the gate electrode 16, for example. The embodiment is not limited to a structure wherein the field plate electrode SFP1 is in contact with the barrier layer 13; rather, an insulating layer may be interposed between the field plate electrode SFP1 and the barrier layer 13.

The field plate electrode SFP2 is arranged on the field plate electrode SFP1 and to project toward the gate electrode 16. In other words, the field plate electrode SFP2 is arranged in a shape of a staircase ascending toward the gate electrode 16. The edge of the field plate electrode SFP2 is located in a position closer to the drain electrode 15 than the edge of the gate electrode 16. The height from the barrier layer 13 of the field plate electrode SFP2 is greater than the height of the gate electrode 16. The field plate electrode SFP2 is made of aluminum (Al), for example.

The embodiment is not limited to a structure in which the field plate electrode SFP2 is in contact with the field plate electrode SFP1; rather an insulating layer may be interposed between the field plate electrode SFP2 and the field plate electrode SFP1. In other words, the field plate electrode SFP1 and the field plate electrode SFP2 have an overlap or contact point on a projection plane in a direction in which the layers are stacked (the vertical direction in FIG. 1), and are located at a position in such a manner that the field plate electrode SFP2 is positioned above the field plate electrode SFP1.

In the present specification, it is possible to measure an element type and an element concentration of a semiconductor layer and a semiconductor area with the SIMS (secondary ion mass spectrometry) or the EDX (energy dispersive X-ray spectroscopy). A relative concentration of an element may be determined from a carrier concentration measured by the SCM (scanning capacitance microscopy). The depth, thickness, width, and intervals of an impurity area can be determined by the SIMS, for example. The depth, thickness, width, and intervals of an impurity area can be determined by a comparison image obtained by comparing an SCM image and an atom probe image.

1-2. Operation

Operations of the semiconductor device 1 formed as described above will be described. FIG. 2 is a diagram explaining an operation of the semiconductor device 1. The drain-source capacitance will be referred to as "Cds", a gate-source capacitance will be referred to as "Cgs", and a gate-drain capacitance will be referred to as "Cgd".

In a hetero junction structure between the channel layer 12 and the barrier layer 13, a distortion occurs in the barrier layer 13, as a lattice constant of the barrier layer 13 being smaller than that of the channel layer 12. A piezo effect due to this distortion causes piezo polarization in the barrier layer 13, and a two-dimensional electron gas (2DEG) is generated in the vicinity of the interface between the channel layer 12 and the barrier layer 13. This two-dimensional electron gas serves as a channel between the source electrode 14 and the drain electrode 15. A Schottky barrier created by a junction between the gate electrode 16 and the barrier layer 13 allows for control of a drain current. Since the two-dimensional electron gas has a high electron mobility, the semiconductor device 1 can perform an extremely rapid switching operation.

The semiconductor device 1 is for example a normally-on type. When the semiconductor device 1 is on, 0 V is applied to the gate electrode 16, 0 V is applied to the source electrode 14, and a high voltage (for example, 200 V) is applied to the drain electrode 15. At this time, a channel CH is formed in a channel layer 12 between the drain electrode 15 and the source electrode 14. A drain current flows between the drain electrode 15 and the source electrode 14 via the channel CH formed in the channel layer 12.

When the semiconductor device 1 is off, a negative voltage (for example, −15 V) is applied to the gate electrode 16, 0 V is applied to the source electrode 14, and 200 V is applied to the drain electrode 15, for example. At this time, the thickness of the depletion layer extending below the gate electrode 16 is controlled, and a drain current is interrupted.

Herein, the field plate electrode SFP1 is set to be at the same potential as the source electrode 14. The field plate electrode SFP1 relaxes a local concentration of electric field in the barrier layer 13. The field plate electrode SFP1 particularly relaxes a concentration of an electric field at the edge of the gate electrode 16. It is thus possible to improve withstand voltage of the semiconductor device 1.

The field plate electrode SFP2 is set to the same potential as the source electrode 14. The channel CH is electrically coupled to the drain electrode 15. Thus, the field plate electrode SFP2 constitutes a part of the drain-source capacitance Cds.

In the present embodiment, the field plate electrodes SFP1 and SFP2 are arranged in the shape of a staircase descending from the gate electrode 16 toward the drain electrode 15 (toward the right of the drawing sheet). It is thereby possible to gradually alter the drain-source capacitance Cds from the gate electrode 16 toward the drain electrode 15.

FIG. 3 is a graph explaining the relationship between a drain-source voltage Vds and a capacitance. In FIG. 3, the horizontal axis is the drain-source voltage Vds (V), and the vertical axis is the capacitance (F). FIG. 3 shows a graph of the drain-source capacitance Cds, the gate-source capacitance Cgs, and the gate-drain capacitance Cgd.

In the present embodiment, the gate-drain capacitance Cgd can be reduced mainly by the function of the field plate electrode SFP1. It is thus possible to relax a local concentration of electric field in the barrier layer 13.

It is possible to prevent rapid decrease of the drain-source capacitance Cds mainly by the function of the field plate electrode SFP2. The operation is illustrated in (1) of FIG. 3. Furthermore, it is possible to gradually decrease the drain-source capacitance Cds as the drain-source voltage Vds increases. The operation is illustrated in (2) of FIG. 3. It is thus possible to suppress rapid change of the drain-source voltage Vds. Any noise that occurs in a switching operation of the semiconductor device 1 can thus be reduced.

1-3. Advantageous Effects of First Embodiment

According to the first embodiment, it is possible to relax a local concentration of an electric field in the barrier layer 13 through providing the field plate electrodes SFP1 and SFP2 electrically coupled to the source electrode 14. It is thus possible to improve withstand voltage of the semiconductor device 1.

By arranging the field plate electrodes SFP1 and SFP2 in the shape of a staircase it is possible to gradually decrease the drain-source capacitance Cds as the drain-source voltage Vds increases. It is thus possible to suppress rapid change to the drain-source voltage Vds. As a result, it is possible to reduce any noise that occurs during a switching operation of the semiconductor device 1. In turn, a semiconductor device 1 capable of improving operation characteristics can be realized.

2. Second Embodiment

In the second embodiment, three field plate electrodes are arranged in the shape of a staircase descending from the gate electrode 16 toward the drain electrode 15.

FIG. 4 is a cross-sectional view of a semiconductor device 1 according to the second embodiment. The semiconductor device 1 includes field plate electrodes SFP1 to SFP3. The structures of the field plate electrodes SFP1 and SFP2 are the same as those in the first embodiment.

The field plate electrode SFP3 is provided on the field plate electrode SFP2 and formed to project toward the gate electrode 16. The edge of the field plate electrode SFP3 is located in a position closer to the drain electrode 15 than the edge of the gate electrode 16. The height from the barrier layer 13 of the field plate electrode SFP3 is greater than the height of the gate electrode 16. The field plate electrode SFP3 is made of aluminum (Al), for example. The field plate electrode SFP3 is electrically coupled to the source electrode 14.

The field plate electrodes SFP1 to SFP3 are arranged in the shape of a staircase descending from the gate electrode 16 toward the drain electrode 15 (toward the right of the drawing).

With the semiconductor device 1 formed in this manner it is thereby possible to gradually change the drain-source capacitance Cds from the gate electrode 16 toward the drain electrode 15. It is possible to gradually decrease the drain-source capacitance Cds as the drain-source voltage Vds increases. It is thereby possible to reduce any noise that occurs during a switching operation of the semiconductor device 1. The other effects are the same as those in the first embodiment.

3. Third Embodiment

In the third embodiment, a field plate electrode is arranged in the shape of a staircase ascending from the gate electrode 16 toward the drain electrode 15 in addition to the arrangement of the field plate electrode in the first embodiment.

FIG. 5 is a cross-sectional view of a semiconductor device 1 according to a third embodiment. The semiconductor device 1 includes field plate electrodes SFP1 to SFP3. The structures of the field plate electrodes SFP1 and SFP2 are the same as those in the first embodiment.

The field plate electrode SFP3 is provided on the field plate electrode SFP1 and formed to project toward the drain electrode 15. The edge of the field plate electrode SFP3 is located in a position closer to the drain electrode 15 than the edge of the field plate electrode SFP1. The height from the barrier layer 13 of the field plate electrode SFP3 is greater than the height of the gate electrode 16. The field plate electrode SFP3 is made of aluminum (Al), for example. The field plate electrode SFP3 is electrically coupled to the source electrode 14.

The field plate electrodes SFP1 to SFP3 are arranged in the shape of a staircase ascending from the gate electrode 16 toward the drain electrode 15 (toward the right of the drawing sheet).

A semiconductor device 1 formed in this manner can relax a local concentration of electric field in the barrier layer 13. The gate-drain capacitance Cgd can be further reduced. Furthermore, it is possible to gradually decrease the drain-source capacitance Cds as the drain-source voltage Vds increases. The other effects are the same as those in the first embodiment.

As a modification, the field plate electrode SFP3 of the second embodiment may be applied to the third embodiment.

4. Fourth Embodiment

The fourth embodiment is a modification of the third embodiment, and a field plate electrode on the field plate electrode SFP1 is constituted by a continuous layer in the fourth embodiment.

FIG. 6 is a cross-sectional view of a semiconductor device 1 according to the fourth embodiment. The semiconductor device 1 includes field plate electrodes SFP1 and SFP2. The structures of the field plate SFP1 are the same as those in the first embodiment.

The field plate electrode SFP2 is provided on the field plate electrode SFP1 and formed in such a manner as to project from both sides of the field plate electrode SFP1. In other words, the field plate electrode SFP2 includes a first electrode part projecting from the field plate electrode SFP1 toward the gate electrode 16 and a second electrode part projecting from the field plate electrode SFP1 toward the drain electrode 15. One edge of the field plate electrode SFP2 is located in a position closer to the drain electrode 15 than the gate electrode 16, and the other edge of the field plate electrode SFP2 is located in a position closer to the gate electrode 16 than the drain electrode 15. The height from the barrier layer 13 of the field plate electrode SFP2 is greater than the height of the gate electrode 16. The field plate electrode SFP2 is made of aluminum (Al), for example. The field plate electrode SFP2 is electrically coupled to the source electrode 14.

The fourth embodiment can simplify the manufacturing process compared to the third embodiment. The other effects are the same as those in the third embodiment.

As a modification, the field plate electrode SFP3 of the second embodiment may be applied to the fourth embodiment.

5. Fifth Embodiment

In the fifth embodiment, the semiconductor device 1 includes field plate electrodes arranged in a convex shape protruding from the gate electrode 16 toward the drain electrode 15 in addition to the structure of the field plate electrode in the third embodiment.

Figure 7:
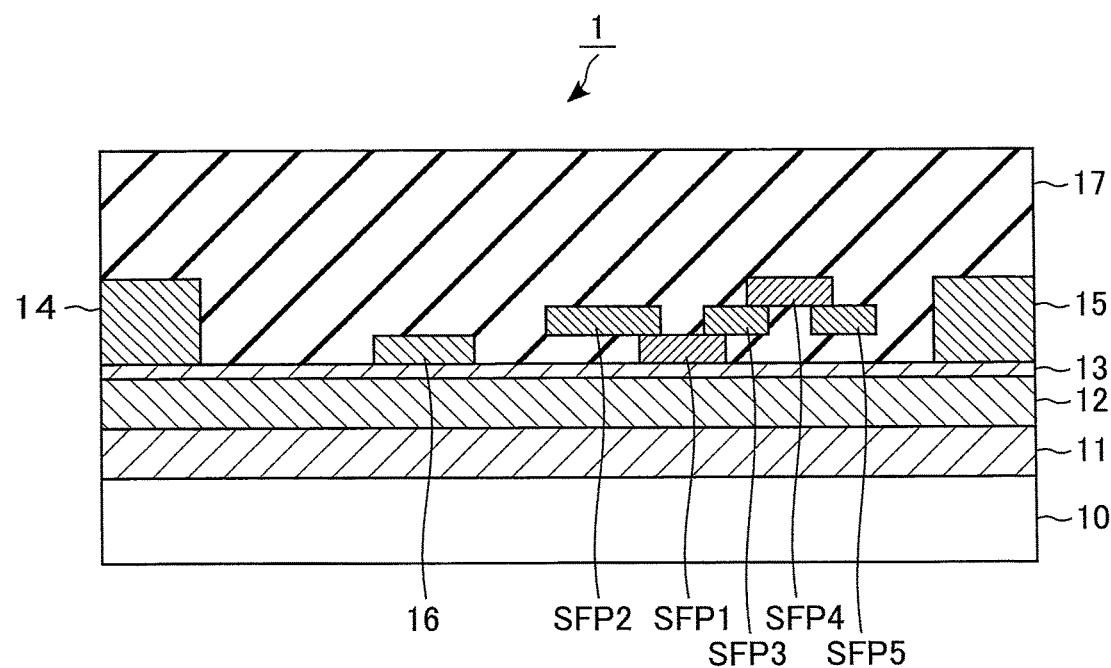
FIG. 7 is a cross-sectional view of a semiconductor device according to a fifth embodiment.

FIG. 7 is a cross-sectional view of a semiconductor device 1 according to the fifth embodiment. The semiconductor device 1 includes field plate electrodes SFP1 to SFP5. The structures of the field plate electrodes SFP1 to SFP3 are the same as those in the third embodiment.

The field plate electrode SFP4 is provided on the field plate electrode SFP3 and formed to project toward the drain electrode 15. The field plate electrodes SFP1, SFP3, and SFP4 are arranged in the shape of a staircase ascending from the gate electrode 16 toward the drain electrode 15.

The field plate electrode SFP5 is provided below the field plate electrode SFP4 and formed to project toward the drain electrode 15. The field plate electrode SFP5 is arranged in an interconnect layer at the same level as the field plate electrode SFP3. The field plate electrodes SFP4 and SFP 5 are arranged in the shape of a staircase descending from the gate electrode 16 toward the drain electrode 15.

In other words, the field plate electrodes SFP1 and SFP3 to SFP5 have a convex shape.

The field plate electrodes SFP4 and SFP5 are made of aluminum (Al), for example. The field plate electrodes SFP4 and SFP5 are electrically coupled to the source electrode 14.

A semiconductor device 1 formed in this manner can relax a local concentration of electric field in the barrier layer 13. The gate-drain capacitance Cgd can be further reduced. Furthermore, it is possible to gradually decrease the drain-source capacitance Cds as the drain-source voltage Vds increases. The other effects are the same as those in the first embodiment.

As a modification, the semiconductor device 1 may be formed with the field plate electrode SFP5 omitted. The fifth embodiment may be applied to the second embodiment.

6. Sixth Embodiment

A semiconductor device 1 of the sixth embodiment further includes two field plate electrodes respectively provided in the source electrode 14 and the drain electrode 15.

FIG. 8 is a cross-sectional view of a semiconductor device 1 according to the sixth embodiment. The structures of the field plate electrodes SFP1 and SFP2 are the same as those in the first embodiment. The semiconductor device 1 further includes a source field plate electrode 18 and a drain field plate electrode 19.

The source field plate electrode 18 is provided on the source electrode 14 and formed to project toward the drain electrode 15. The source field plate electrode 18 is formed to include a first electrode part extending upwardly from the source electrode 14 and a second electrode part extending from the first electrode unit toward the drain electrode 15. The source field plate electrode 18 is formed in such a manner that it covers the gate electrode 16 and the field plate electrodes SFP1 and SFP2. The source field plate electrode 18 is electrically coupled to the source electrode 14. The source field plate electrode 18 is made of aluminum (Al), for example.

The drain field plate electrode 19 is provided on the drain electrode 15 and formed to project toward the source electrode 14. The drain field plate electrode 19 is formed to include a first electrode part upwardly extending from the drain electrode 15 and a second electrode part extending from the first electrode part toward the source electrode 14 side. The edge of the drain field plate electrode 19 is located in a position closer to the drain electrode 15 than the edge of the field plate electrode SFP1. The drain field plate electrode 19 is electrically coupled to the drain electrode 15. The drain field plate electrode 19 is made of aluminum (Al), for example.

In the semiconductor device 1 formed in this manner, the source field plate electrode 18 relaxes a local concentration of electric field in the barrier layer 13. A use of the source field plate electrode 18 can substantially increase a volume of the source electrode 14; therefore, a resistance of the source electrode 14 can be decreased.

The drain field plate electrode 19 relaxes a local concentration of electric field in the barrier layer 13. A use of the drain field plate electrode 19 can substantially increase the volume of the drain electrode 15; therefore, the resistance of the drain electrode 15 can be decreased.

Only one of the source field plate electrode 18 and the drain field plate electrode 19 may be provided.

The sixth embodiment may be applied to the second through fifth embodiments.

In each of the foregoing embodiments, two vertically-arranged field plate electrodes are in contact with each other; however, the embodiments are not limited to this example, and an insulating layer may be interposed between two vertically-arranged field plate electrodes.

In the present specification, "stacking" layers includes a case where a different type of layer is interposed between layers in addition to a case where two layers are stacked so as to be in contact with each other. The expression "provided on" includes a case where another layer is interposed between two layers. In contrast, the expression "provided directly on" excludes a case where another layer is interposed between two layers.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer provided on a substrate;
   a second nitride semiconductor layer provided on the first nitride semiconductor layer and having a band gap wider than that of the first nitride semiconductor layer;
   a source electrode and a drain electrode, being provided on the second nitride semiconductor layer separately from each other;
   a gate electrode provided on the second nitride semiconductor layer and arranged between the source electrode and the drain electrode;
   a first field plate electrode provided on the second nitride semiconductor layer, arranged between the gate electrode and the drain electrode, and electrically coupled to the source electrode;
   a second field plate electrode provided on the first field plate electrode and formed to project toward the gate electrode;
   a fourth field plate electrode provided on the third field plate electrode and formed to project toward the drain electrode; and
   a fifth field plate electrode provided below the fourth field plate electrode and formed to project toward the drain electrode.

2. The semiconductor device according to claim 1, wherein
   a height of the first field plate electrode is equal to or smaller than a height of the gate electrode.

3. The semiconductor device according to claim 2, wherein
   a height of the second field plate electrode is greater than a height of the gate electrode.

4. A semiconductor device comprising:
   a first nitride semiconductor layer provided on a substrate;
   a second nitride semiconductor layer provided on the first nitride semiconductor layer and having a band gap wider than that of the first nitride semiconductor layer;
   a source electrode and a drain electrode, being provided on the second nitride semiconductor layer separately from each other;
   a gate electrode provided on the second nitride semiconductor layer and arranged between the source electrode and the drain electrode;
   a first field plate electrode provided on the second nitride semiconductor layer, arranged between the gate electrode and the drain electrode, and electrically coupled to the source electrode;
   a second field plate electrode provided on the first field plate electrode and formed to project toward the gate electrode; and
   a source field plate electrode provided on the source electrode and formed to project toward the drain electrode.

5. The semiconductor device according to claim 4, further comprising a drain field plate electrode provided on the drain electrode and formed to project toward the source electrode.

6. The semiconductor device according to claim 4, wherein
   a height of the first field plate electrode is equal to or smaller than a height of the gate electrode.

7. The semiconductor device according to claim 6, wherein
   a height of the second field plate electrode is greater than a height of the gate electrode.

* * * * *